(12) United States Patent
Kotani et al.

(10) Patent No.: US 10,242,936 B2
(45) Date of Patent: Mar. 26, 2019

(54) SEMICONDUCTOR DEVICE AND METHOD OF FABRICATING THE SEMICONDUCTOR DEVICE

(71) Applicant: FUJITSU LIMITED, Kawasaki-shi, Kanagawa (JP)

(72) Inventors: Junji Kotani, Atsugi (JP); Norikazu Nakamura, Sagamihara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/680,802

(22) Filed: Aug. 18, 2017

(65) Prior Publication Data

US 2018/0068923 A1 Mar. 8, 2018

(30) Foreign Application Priority Data

Sep. 6, 2016 (JP) .................. 2016-173414

(51) Int. Cl.
| | |
|---|---|
| H01L 23/495 | (2006.01) |
| H01L 29/20 | (2006.01) |
| H01L 29/66 | (2006.01) |
| H01L 29/778 | (2006.01) |
| H01L 29/06 | (2006.01) |
| H03F 1/32 | (2006.01) |

(Continued)

(52) U.S. Cl.
CPC .... *H01L 23/49568* (2013.01); *H01L 29/0649* (2013.01); *H01L 29/2003* (2013.01); *H01L 29/66462* (2013.01); *H01L 29/7786* (2013.01); *H03F 1/3247* (2013.01); *H03F 3/195* (2013.01); *H03F 3/245* (2013.01); *H01L 29/0657* (2013.01); *H01L 2023/4068* (2013.01)

(58) Field of Classification Search
CPC .................................................. H01L 23/49568
USPC ......... 257/625, 675, 705, 706, 717; 438/122
See application file for complete search history.

(56) References Cited

U.S. PATENT DOCUMENTS 8,657,465 B2 * 2/2014 Markell .................. F21V 33/00
362/234
9,236,544 B2 * 1/2016 Jeong ...................... H01L 33/60
(Continued)

FOREIGN PATENT DOCUMENTS

| | | |
|---|---|---|
| JP | 03-242941 | 10/1991 |
| JP | 2007-128994 | 5/2007 |

(Continued)

*Primary Examiner* — Calvin Lee
(74) *Attorney, Agent, or Firm* — Fujitsu Patent Center

(57) ABSTRACT

A disclosed semiconductor device includes a buffer layer formed of a compound semiconductor on a substrate, a first semiconductor layer formed of a compound semiconductor on the buffer layer, a second semiconductor layer formed of a compound semiconductor on the first semiconductor layer, a gate electrode, a source electrode, and a drain electrode formed on the second semiconductor layer, and a heat dissipation part formed below the gate electrode. In the semiconductor device, all or part of the second semiconductor layer and the first semiconductor layer is present between the gate electrode and the heat dissipation part, the heat dissipation part includes a heat dissipation layer and a first intermediate layer formed between the heat dissipation layer and both of the buffer layer and first semiconductor layer, and the heat dissipation layer is formed of a material containing carbon.

19 Claims, 19 Drawing Sheets

(51) Int. Cl.
  *H03F 3/195* (2006.01)
  *H03F 3/24* (2006.01)
  *H01L 23/40* (2006.01)

(56) References Cited

U.S. PATENT DOCUMENTS

| | | | |
|---|---|---|---|
| 9,653,613 B2 * | 5/2017 | Yamazaki | H01L 29/786 |
| 9,954,112 B2 * | 4/2018 | Asami et al. | H01L 29/423 |
| 2012/0043586 A1 | 2/2012 | Nishimori et al. | |

FOREIGN PATENT DOCUMENTS

| | | |
|---|---|---|
| JP | 2008-117885 | 5/2008 |
| JP | 2012-044113 | 3/2012 |

* cited by examiner

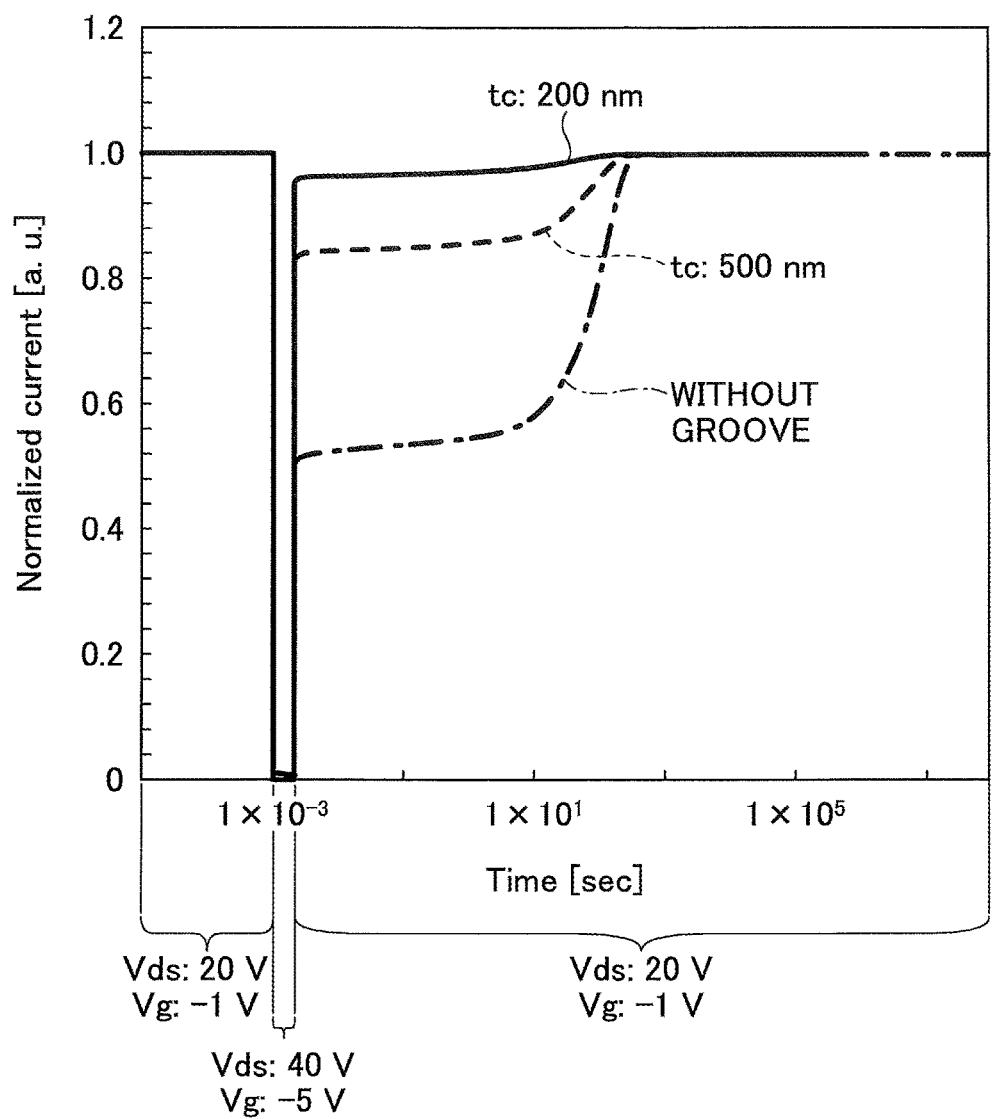

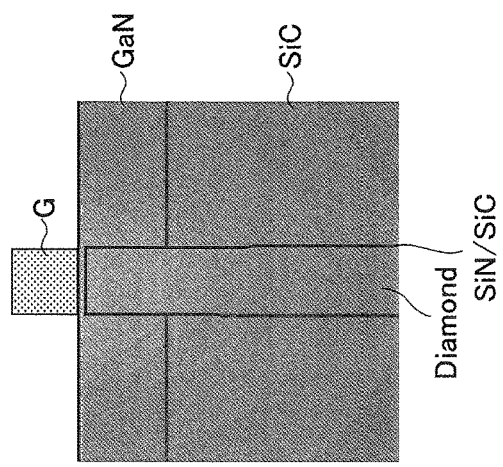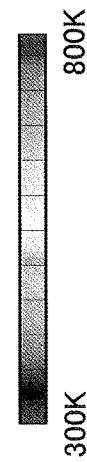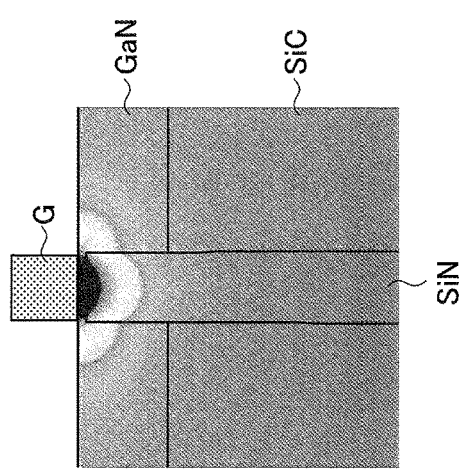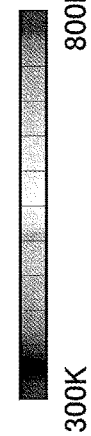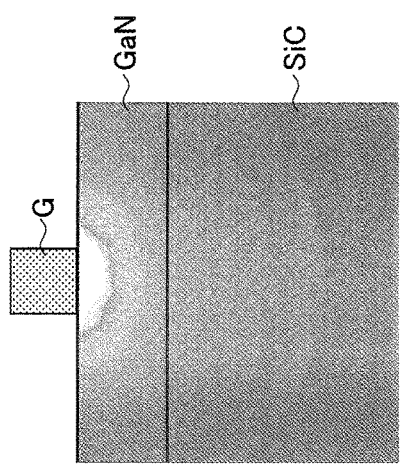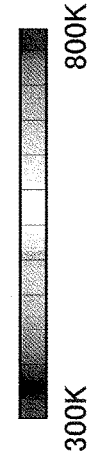

SEMICONDUCTOR DEVICE AND METHOD OF FABRICATING THE SEMICONDUCTOR DEVICE

CROSS-REFERENCE TO RELATED APPLICATION

This patent application is based upon, and claims the benefit of priority of Japanese Patent Application No. 2016-173414 filed on Sep. 6, 2016, the entire contents of which are incorporated herein by reference.

FIELD

The embodiments discussed herein are related to a semiconductor device and a method for fabricating the semiconductor device.

BACKGROUND

Application of nitride semiconductors to semiconductor devices with high breakdown voltage and high output power is being studied by utilizing characteristics such as high electron saturation velocity and wide band gap. For example, the bandgap of gallium nitride (GaN) is 3.4 eV, which is greater than the band gap (1.1 eV) of silicon (Si) and the band gap (1.4 eV) of gallium arsenide (GaAs), and has high breakdown electric field. Therefore, nitride semiconductors such as GaN are highly promising as materials for power supply semiconductor devices to be operated at high voltage and to obtain high output power.

As semiconductor devices using nitride semiconductors, there have been many reports on field effect transistors, particularly high electron mobility transistors (HEMTs). For example, in GaN-based HEMTs (GaN-HEMTs), attention has been paid to HEMTs using GaN as an electron transit layer and AlGaN as a barrier layer or HEMTs using InAlGaN as a barrier layer. Specifically, HEMTs using InAlGaN as the barrier layer have two-dimensional electron gas (2DEG) with a density two to three times higher than that of HEMT using AlGaN as the barrier layer, which is advantageous for increasing the output power of the device. Further, in general, a gate length of the device is reduced in order to implement a large current operation.

Meanwhile, in the HEMT using the nitride semiconductor, as a drain voltage is increased, a state where the gate is below the pinch-off voltage, that is, an off-leakage current bypassing below the gate electrode may flow despite the transistor being in an off-state.

In GaN-HEMT, in order to grow GaN or the like on a substrate such as sapphire or silicon carbide (SiC), a buffer layer is formed on the substrate, and a GaN crystal is formed on the formed buffer layer. The thus formed buffer layer exhibits poor crystal quality; such a buffer layer may contain a large amount of impurity elements or may include lattice defects such as point defects and dislocations at high density.

Since these impurities and crystal defects in the buffer layer form an electron trap level in the buffer layer, the electron traps capture and release electrons during transistor operation, leading to current collapse. Specifically, electrons are susceptible to becoming injected into the buffer layer where located below the gate electrode, and the buffer layer below the gate electrode frequently causes a large current collapse.

As a structure for reducing both such off-leakage current and current collapse, a method for removing a semiconductor layer where below the gate electrode from the back surface (bottom surface in the figure) to form a groove, a method for embedding this groove with SiN, etc., is disclosed.

RELATED ART DOCUMENTS

Patent Documents

Patent Document 1: Japanese Laid-open Patent Publication No. 2008-117885
Patent Document 2: Japanese Patent No. 5678517

SUMMARY

According to an aspect of the embodiments, a semiconductor device includes a buffer layer formed of a compound semiconductor on a substrate; a first semiconductor layer formed of a compound semiconductor on the buffer layer; a second semiconductor layer formed of a compound semiconductor on the first semiconductor layer; a gate electrode, a source electrode, and a drain electrode formed on the second semiconductor layer; and a heat dissipation part formed below the gate electrode. In the semiconductor device, all or part of the second semiconductor layer and the first semiconductor layer is present between the gate electrode and the heat dissipation part, the heat dissipation part includes a heat dissipation layer and a first intermediate layer formed between the heat dissipation layer and both of the buffer layer and first semiconductor layer, and the heat dissipation layer is formed of a material containing carbon.

It is to be understood that both the foregoing general description and the following detailed description are exemplary and explanatory and are not restrictive of the invention.

Additional objects and advantages of the embodiments will be set forth in part in the description which follows, and in part will be obvious from the description, or may be learned by practice of the invention.

BRIEF DESCRIPTION OF THE DRAWINGS

FIG. 5 is a graph illustrating current collapse of a semiconductor device obtained by simulation;
FIGS. 6A to 6C are explanatory views of a heat distribution of a semiconductor device obtained by simulation.

DESCRIPTION OF EMBODIMENTS

Figure 1:
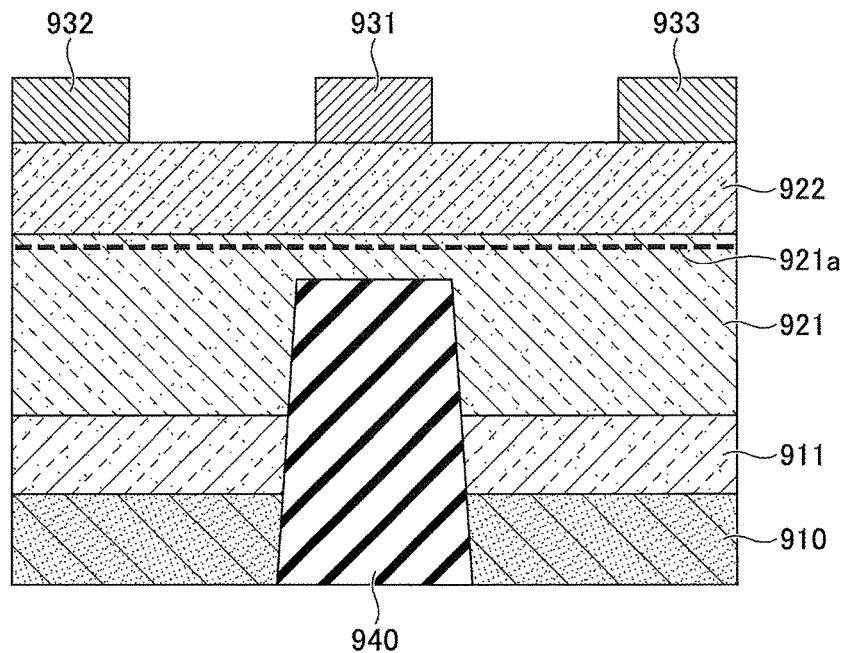
FIG. 1 is a structural view of a semiconductor device in which a current element film is formed.

Gallium nitride (GaN) based high electron mobility transistors (GaN-HEMTs) are frequently used for high power applications and therefore readily to generate heat. However, a GaN-HEMT including a structure having a groove in a back surface (i.e., a bottom surface in the figure) of the substrate or including a structure having such a groove embedded with SiN or the like is not radily radiate heat, and hence, heat is likely to accumulate in a GaN-HEMT having such a structure. As a result, the GaN-HEMT may easily reach high temperatures to result in breakdown or the like.

Hence, semiconductor devices capable of controlling both off-leakage current and current collapse so as not to easily reach high temperature are required.

The following describes embodiments of the present invention with reference to the accompanying drawings. In the following description, components that are the same are designated with the same reference numerals, and a description thereof will be omitted.

First Embodiment

First, a description is given, with reference to FIG. 1, of a semiconductor device formed of a nitride semiconductor. The semiconductor device has a groove formed by removing a semiconductor layer below a gate electrode and the groove is filled with SiN. The semiconductor device is a GaN-HEMT having a not-illustrated nucleation layer, a buffer layer 911, an electron transit layer 921, and a barrier layer 922 that are formed on a substrate 910, as illustrated in FIG. 1. The semiconductor device further includes a gate electrode 931, a source electrode 932, and a drain electrode 933 formed on the barrier layer 922.

The substrate 910 uses a Si substrate. The nucleation layer is formed of aluminum nitride (AlN) or the like, and the buffer layer 911 is formed of aluminum gallium nitride (AlGaN), gallium nitride (GaN), or the like. The electron transit layer 921 is formed of GaN, and the barrier layer 922 is formed of AlGaN. As a result, the 2DEG 921a is generated in the electron transit layer 921 in the vicinity of an interface between the electron transit layer 921 and the barrier layer 922.

The semiconductor device further includes a current preventing film 940 formed as follows; a groove is formed below the gate electrode 931 by removing respective parts of the substrate 910, the buffer layer 911, and the electron transit layer 921 from the back side (bottom side in the figure) of the substrate 910, and the groove is then embedded with SiN. Since SiN is an insulator, forming the current preventing film 940 with SiN below the gate electrode 931 may enable to control against both the off-leakage current and the current collapse.

In order to obtain high output, a large current is applied to GaN-HEMTs at high voltage; however, since the current flowing through GaN-HEMTs is large, GaN-HEMTs generate heat and tend to be at high temperature. However, when the current preventing film 940 is formed of SiN, thermal conductivity of SiN is 3 W/mK, which is extremely lower than 160 W/mK of thermal conductivity of GaN. Hence, the semiconductor device does not easily dissipate heat through the current preventing film 940, and easily accumulates heat, which is likely to cause a failure.

Semiconductor Device

Figure 2:
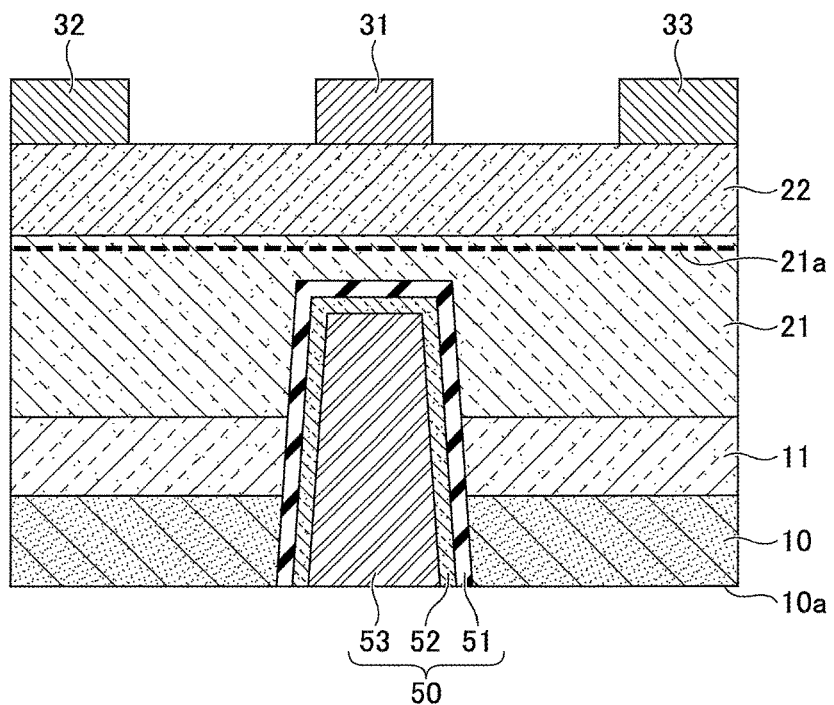
FIG. 2 is a structural view of a semiconductor device according to a first embodiment.

Next, a semiconductor device according to a first embodiment is described. The semiconductor device according to the first embodiment is a GaN-HEMT having a not-illustrated nucleation layer, a buffer layer 11, an electron transit layer 21, and a barrier layer 22 that are formed on a substrate 10, as illustrated in FIG. 2. The semiconductor device further includes a gate electrode 31, a source electrode 32, and a drain electrode 33 formed on the barrier layer 22. In the present application, the electron transit layer 21 may be referred to as a first semiconductor layer and the barrier layer 22 may be referred to as a second semiconductor layer.

As the substrate 10, a substrate formed of Si, SiC, sapphire, GaN, or the like may be used. In this embodiment, a Si substrate is used as the substrate 10. The nucleation layer is formed of an aluminum nitride (AlN) layer having a thickness of approximately 160 nm, and the buffer layer 11 is formed of a multilayer film or the like having alternately layered AlGaN with different compositions, and the thickness of the buffer layer 11 is approximately 500 nm. The electron transit layer 21 is formed of a GaN layer having a thickness of 1 μm, and the barrier layer 22 is formed of an $Al_{0.2}Ga_{0.8}N$ layer having a thickness of 20 nm. The barrier layer 22 may also be formed of InAlGaN or InAlN, other than AlGaN. Although not depicted in the figures, a cap layer may be formed of GaN or n-GaN on the barrier layer 22.

In the semiconductor device of the first embodiment, a heat dissipation part 50 is formed below a region where the gate electrode 31 is formed. The heat dissipation part 50 forms a groove by removing part of the substrate 10, the buffer layer 11, and the electron transit layer 21 from aback surface 10a (bottom surface in the figure) of the substrate 10 in a region where the gate electrode 31 is formed, and embedding the groove. The groove is formed once the thickness of the electron transit layer 21 reaches approximately 200 nm. The heat dissipation part 50 is formed by layering a first intermediate layer 51, a second intermediate layer 52, and a heat dissipation layer 53 in this groove. The first intermediate layer 51 is formed of an insulating film such as SiN, $SiO_2$, AlN, $Al_2O_3$, SiCN, SiC or the like and has a thickness of 10 nm or less, for example, approximately 5 nm. Note that the first intermediate layer 51 may preferably be formed of an insulating film. The second intermediate layer 52 is formed of silicon carbide (SiC) or the like; however, the second intermediate layer 52 may be formed of silicon carbonitride (SiCN), and have a thickness of 10 nm or less, for example, approximately 5 nm. The heat dissipation layer 53 is a material containing carbon (C) such as carbon nanotube, graphene, diamond, nanodiamond or the like, and having high thermal conductivity. In the first embodiment, the heat dissipation layer 53 is made of diamond.

By forming the second intermediate layer 52 with SiC, adhesive force between the second intermediate layer 52 and the heat dissipation layer 53 may be enhanced. Specifically, since the SiC contains carbon (C) and the heat dissipation layer 53 is made of a material containing carbon such as diamond, both the second intermediate layer 52 and the heat dissipation layer 53 contain carbon. Hence, the adhesive force between the second intermediate layer 52 and the heat dissipation layer 53 may be enhanced.

By providing the second intermediate layer 52 between the nitride semiconductor layer and the heat dissipation layer 53, phonon transport from the nitride semiconductor layer to the heat dissipation layer 53 maybe promoted. Therefore, since the role of the second intermediate layer 52 formed of SiC is phonon intermediation at the interface, it is not necessary to increase the thickness. Accordingly, the thickness of the second intermediate layer 52 may be as thin as 10 nm or less, for example, approximately 5 nm.

In a case where the first intermediate layer 51 is formed of SiN containing Si or $SiO_2$, the adhesive force between the first intermediate layer 51 and the second intermediate layer 52 similarly containing Si may be enhanced. In a case where the first intermediate layer 51 is formed of SiN containing N or AlN, the adhesive force between the first intermediate layer 51 and the nitride semiconductor similarly containing N may be enhanced. Accordingly, the adhesive force between the second intermediate layer 52 and the first intermediate layer 51, and the adhesive force between the first intermediate layer 51 and the nitride semiconductor layer may both be enhanced by forming the first intermediate layer 51 of SiN.

In a case where the first intermediate layer 51 is formed of AlN or the like, the second intermediate layer 52 may preferably be formed of aluminum carbide (AlC) or the like made of carbon and aluminum. In a case where the first intermediate layer 51 is formed of AlN or SiN, the second intermediate layer 52 may preferably be made of carbon nitride or the like. Furthermore, the second intermediate layer 52 may be formed of silicon alumina nitride (SiAlN).

In a case where the heat dissipation layer 53 has electrical conductivity, a capacitance is formed by a nitride semiconductor layer sandwiched between the gate electrode 31 and the heat dissipation layer 53. Accordingly, the heat dissipation layer 53 may preferably be formed of a material having low electrical conductivity.

Characteristics of Semiconductor Device

Figure 3:
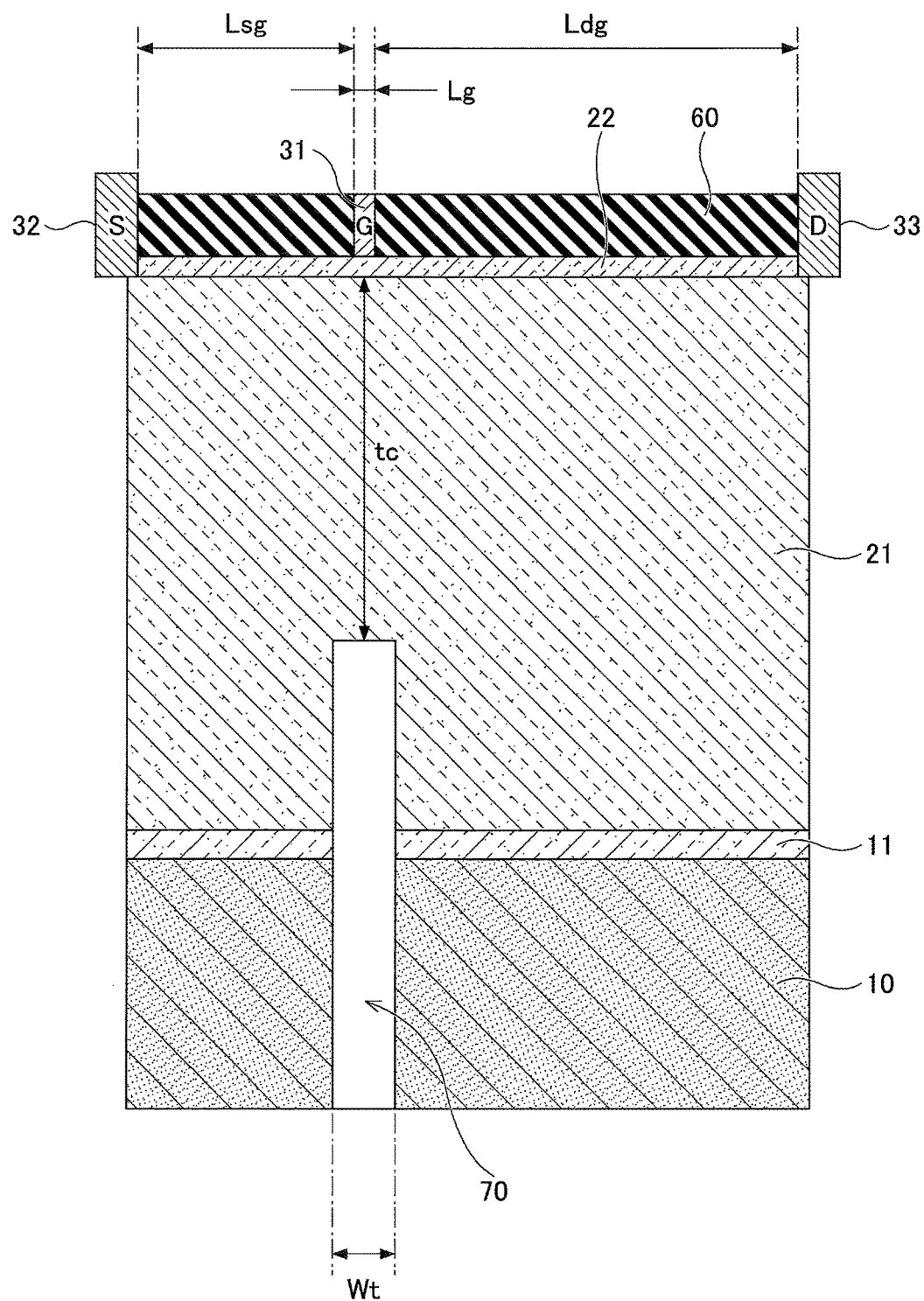
FIG. 3 is a simulation model diagram of a semiconductor device.

Next, a method for fabricating a semiconductor device according to the embodiment is described. First, off-leak characteristics in the semiconductor device in the first embodiment will be described. FIG. 3 is a simulation model used for explaining the off-leak characteristics of the semiconductor device in this embodiment. In this model, the substrate 10 is formed of SiC having a thickness of approximately 370 nm, the thickness of the buffer layer 11 is approximately 30 nm, the thickness of the electron transit layer 21 is approximately 600 nm, and the thickness of the barrier layer 22 is approximately 20 nm. A protective film 60 formed of SiN having a thickness of 50 nm is formed on the barrier layer 22. A width Lg of the gate electrode 31 is 200 nm, an interval Lsg between the gate electrode 31 and the source electrode 32 is 1.5 μm, and an interval Ldg between the gate electrode 31 and the drain electrode 33 is 3.5 μm. Simulation was performed by varying the depth of the groove 70 formed directly below the gate electrode 31 to vary a thickness tc of the electron transit layer 21 in a region directly below the gate electrode 31. The width Wt of the groove is 400 nm.

Figure 4:
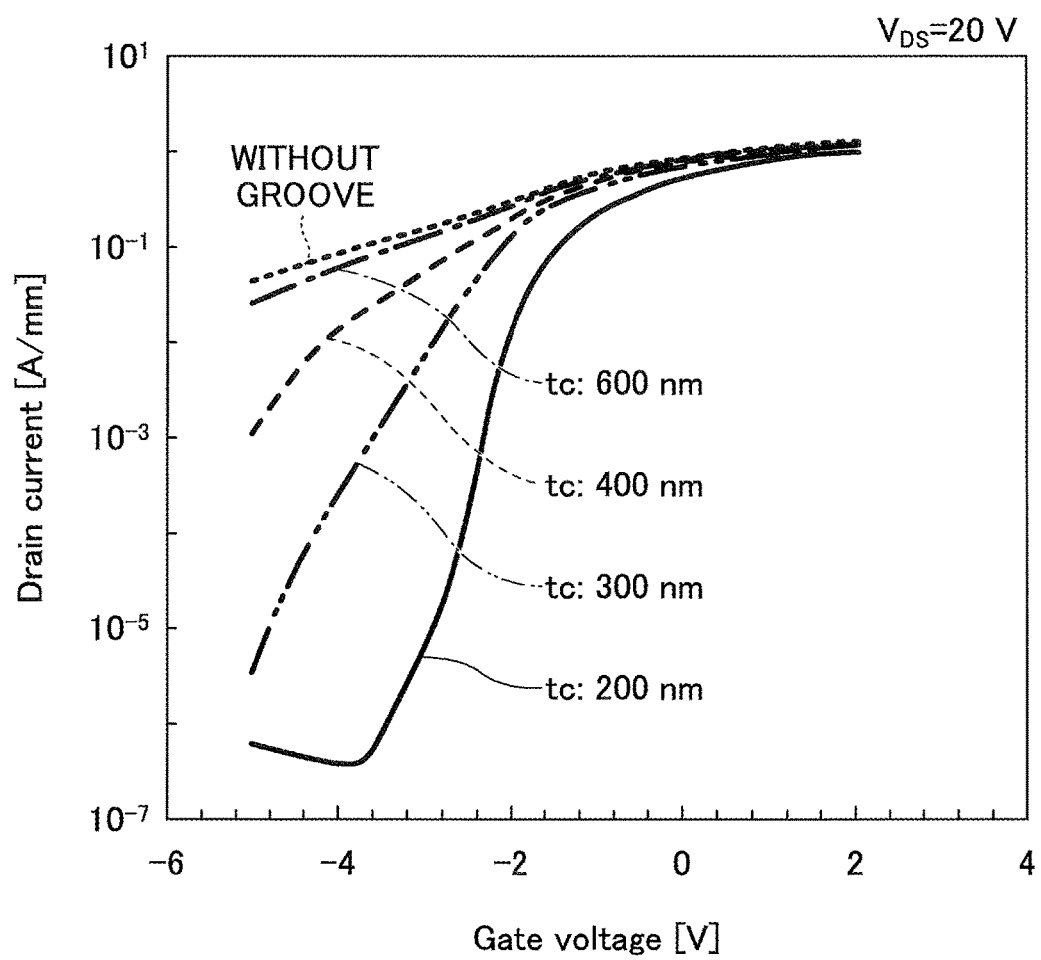
FIG. 4 is a graph illustrating an off-leak characteristic of a semiconductor device obtained by simulation.

FIG. 4 indicates a relationship between a gate voltage and a drain current in a case where the depth of the groove 70 is varied in the simulation model illustrated in FIG. 3. Note that it is assumed that the drain-source voltage is 20 V, the gate voltage applied when the device is in an ON state is +2 V, and the gate voltage applied when the device is in an OFF state is −4 V. In a case where a groove is not formed, an off leak current of $1\times10^{-2}$ A/mm or more will flow even by lowering the gate voltage in order to bring the device to be in an OFF state. The off-leak current decreases by increasing depth of the groove 70, that is, by reducing the thickness tc of the electron transit layer 21 in the region directly below the gate electrode 31. When the thickness tc of the electron transit layer 21 in the region directly below the gate electrode 31 reaches 400 nm or less, the off-leak current abruptly decreases. Further, in the case where the thickness tc of the electron transit layer 21 is 200 nm, the off-leakage current will be $1\times10^{-6}$ A/mm or less, the off-leakage current may be reduced by approximately 5 orders of magnitude as compared with the case where the groove 70 is not formed. Accordingly, satisfactory OFF characteristics with an ON/OFF ratio of 6 orders of magnitude or greater may be obtained. The above description given is based on an example with the groove 70 being formed has been described; however, the same applies to an example with the heat dissipation part 50 being formed in the groove 70 as in the semiconductor device according to the first embodiment.

Next, control of the current collapse in the semiconductor device according to the first embodiment will be described with reference to FIG. 5.

FIG. 5 depicts characteristics of the current collapse that has been studied in a case where the depth of the groove 70 is varied in the simulation model illustrated in FIG. 3. This simulation also includes traps of electrons apart from the buffer layer 11. More specifically, the drain-source voltage Vds is applied at 20 V and the gate voltage Vg is applied at −1 V in a duration from the start to $1\times10^{-3}$ sec. As a result, the semiconductor device will be in an ON-state, and a predetermined drain current flows. The drain-source voltage Vds is applied at 40 V and the gate voltage Vg is applied at −5 V in a duration from $1\times10^{-3}$ sec to $1.5\times10^{-3}$ sec. As a result, the semiconductor device is in an OFF-state, and the flow of the drain current will stop. After $1.5\times10^{-3}$ sec, the drain-source voltage Vds is applied at 20 V and the gate voltage Vg is applied at −1 V. As a result, the semiconductor device will be in an ON-state and a predetermined drain current should flow. However, in a case where current collapse has occurred, the current does not reach the predetermined current level immediately, and the level of the current that has just started flowing will be lower than the predetermined current level.

Specifically, as illustrated in FIG. 5, in a case where the groove is not formed and the transistor is turned ON after being in an OFF state, only half of the drain current flows due to the current collapse, and the drain current will not immediately return to the original current value. In a case where the groove 70 is formed in the semiconductor device and the thickness tc of the electron transit layer 21 in the region immediately below the gate electrode 31 is set to 500 nm, the current collapse is slightly controlled, however, the drain current is returned only to approximately 80% of the original current value. Furthermore, in a case where the groove 70 formed into the semiconductor device is deepened and the thickness tc of the electron transit layer 21 in the region immediately below the gate electrode 31 is set to 200 nm, the current collapse is controlled and the drain current flows by approximately 95% of the original current value.

The above description given is based on an example with the groove 70 being formed has been described; however, the same applies to an example with the heat dissipation part 50 being formed in the groove 70 as in the semiconductor device according to the first embodiment.

In addition, in order to allow sufficient ON current to flow, the thickness of the electron transit layer 21 may preferably be 50 nm or more. As described above, in the semiconductor device of the first embodiment, the thickness tc of the electron transit layer 21 in the region immediately below the gate electrode 31 may preferably be 50 nm or more and 500 nm or less, more preferably be 50 nm or more and 300 nm or less, and still more preferably be 50 nm or more and 200 nm or less.

Next, heat dissipation characteristics of the semiconductor device will be described with reference to FIGS. 6A to 6C. FIGS. 6A to 6C are views depicting distribution of heat generated between the gate electrode and the nitride semiconductor layer by operating the semiconductor device. In FIGS. 6A to 6C, a thin layer of a nitride semiconductor such as a buffer layer and a barrier layer, a source electrode and a drain electrode are omitted for the purpose of convenience.

FIG. 6A is a model corresponding to an ordinary GaN-HEMT in which no groove or the like is formed in the back surface (bottom surface in the figure) of the substrate. Specifically, GaN is formed as a nitride semiconductor layer on the SiC corresponding to the substrate, a metal film. G corresponding to the gate electrode 931 is formed on the nitride semiconductor layer, and no groove or the like is formed in the back surface (bottom surface in the figure) of the substrate.

FIG. 6B is a model corresponding to the semiconductor device having the structure of FIG. 1. Specifically, GaN is formed as a nitride semiconductor layer on the SiC corresponding to the substrate, a metal film G corresponding to the gate electrode 931 is formed on the nitride semiconductor layer, and SiN corresponding to the current preventing film 940 is formed below the metal film G. The thickness of the nitride semiconductor layer below the metal film G is 100 nm.

FIG. 6C is a model corresponding to the semiconductor device according to the first embodiment. Specifically, GaN is formed as a nitride semiconductor layer on the SiC corresponding to the substrate, and a metal film G corresponding to the gate electrode 31 is formed on the nitride semiconductor layer. Under the metal film G, SiN having a thickness of 5 nm, SiC having a thickness of 5 nm, and diamond corresponding to the heat dissipation part 50 are formed in order. The thickness of the nitride semiconductor layer below the metal film G is 100 nm.

Note that the thermal conductivity of SiC is 400 W/mK, the thermal conductivity of GaN is 160 W/mK, the thermal conductivity of a-SiN is 3 W/mK, and the thermal conductivity of diamond is 2000 W/mK.

As depicted in FIG. 6A, in the normal GaN-HEMT in which no groove or the like is formed, heat is generated between the gate electrode 931 and the nitride semiconductor layer; because the heat does not readily dissipate and it accumulates in the electron transit layer 921 formed of GaN, and this portion becomes high temperature.

In a case of the semiconductor device having the structure depicted in FIG. 1, the thermal conductivity of a-SiN formed below the gate electrode 931 is 3 W/mK, which is extremely lower than the thermal conductivity of GaN and SiC, indicating 1/50 or less of the thermal conductivity of GaN and 1/100 or less of the thermal conductivity of SiC. As depicted in FIG. 6B, radiation of heat generated between the gate electrode 931 and the nitride semiconductor layer is shielded by the current preventing film 940, which results in heat accumulation in the nitride semiconductor layer. As a result, the temperature in the region immediately below the gate electrode 931 will be higher than in a case depicted in FIG. 6A, and the temperature in the region immediately below the gate electrode 931 reaches 800 K. A nitride semiconductor layer reaching high temperatures as above will result in breakdown of the semiconductor device and will also reduce the lifetime of the device.

In the semiconductor device according to the first embodiment, the heat dissipation layer 53 of the heat dissipation part 50 formed immediately below the gate electrode 31 is formed of diamond having a thermal conductivity of 2000 W/mK, which is higher than the thermal conductivity of GaN or SiC, and is extremely high compared with the thermal conductivity of SiN. Accordingly, even when heat is generated between the gate electrode 931 and the nitride semiconductor layer as depicted in FIG. 6C, heat is radiated through the heat dissipation part 50 without obstruction; hence little heat will be stored in a region between the gate electrode 931 and the nitride semiconductor layer. As a result, the temperature of the region immediately below the gate electrode 31 will be lower than 400 K, thereby reducing the temperature of the region to be lower than that of the semiconductor device depicted in FIGS. 6A and 6B.

That is, although the semiconductor device having the structure depicted in FIG. 1 is enabled to control both the off-leakage current and the current collapse, the heat dissipation is interrupted by a current blocking layer formed for the control. As a result, the nitride semiconductor layer will have high temperature, which may result in breakdown and the like.

Figure 7:
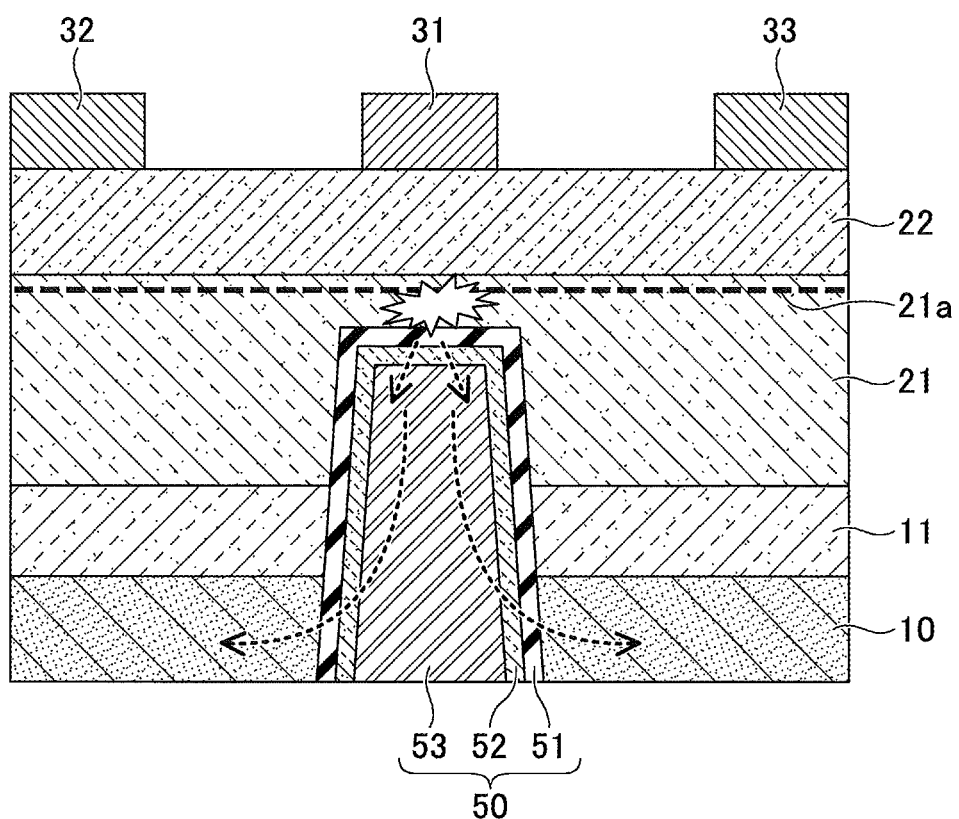
FIG. 7 is an explanatory view of heat dissipation of the semiconductor device in the first embodiment.

In the semiconductor device according to the first embodiment, both the off-leakage current and the current collapse may be controlled similar to the semiconductor device having the structure depicted in FIG. 1. Accordingly, since the nitride semiconductor layer is prevented from reaching a high temperature, the semiconductor device may be prevented from breakdown or the like despite flowing of a large current to generate heat. FIG. 7 depicts a state of radiation of heat generated between the gate electrode and the nitride semiconductor layer in the semiconductor device according to the first embodiment, indicated by broken line arrows.

Note that the thermal conductivity of carbon nanotube is 3000 to 5000 W/mK, and the thermal conductivity of graphene is approximately 5000 W/mK.

Method for Fabricating Semiconductor Device

Next, a method for fabricating a semiconductor device according to the first embodiment will be described. The method for fabricating a semiconductor device in the first embodiment includes epitaxially growing a nitride semiconductor layer on a silicon substrate that will be the substrate 10. In the first embodiment, a case where the nitride semiconductor layer is formed by metal organic chemical vapor deposition (MOCVD) will be described. When the nitride semiconductor layer is formed by MOCVD, trimethylaluminum (TMA) is used as a raw material gas of Al, trimethylgallium (TMG) is used as a raw material gas of Ga, and ammonia ($NH_3$) is used as a raw material gas of N. Note that the nitride semiconductor layer may be formed by molecular beam epitaxy (MBE).

Figure 8A:
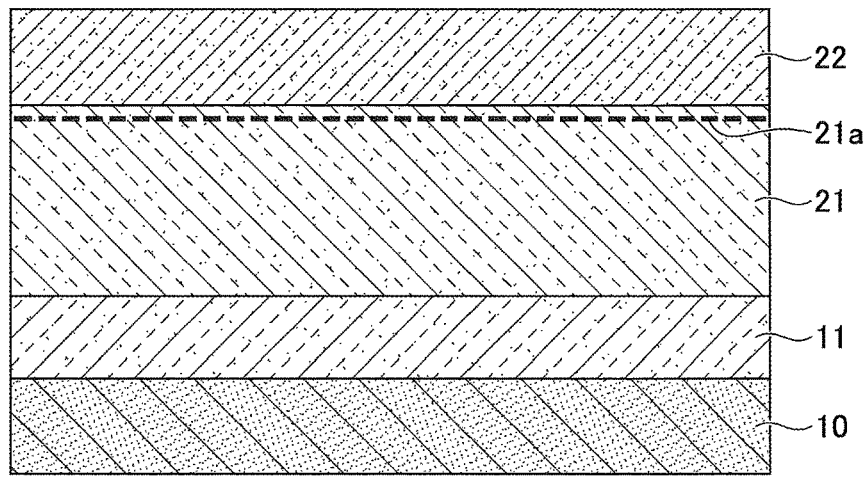
FIGS. 8A and 8B are process diagrams (1) of a method for fabricating a semiconductor device according to the first embodiment.

First, as depicted in FIG. 8A, a nucleation layer (not illustrated), a buffer layer 11, an electron transit layer 21, and a barrier layer 22 are sequentially formed on a substrate 10 using a nitride semiconductor. Specifically, the nucleation layer (not illustrated) is formed of an AlN film having a thickness of 160 nm. The buffer layer 11 is formed of a multilayer film or the like having alternately layered AlGaN with different compositions, and has a thickness of approximately 500 nm. The electron transit layer 21 is formed of a GaN layer having a thickness of 1 μm, and the barrier layer 22 is formed of an $Al_{0.2}Ga_{0.8}N$ layer having a thickness of 20 nm. As a result, in the electron transit layer 21, 2DEG 21a is generated in the proximity of the interface between the electron transit layer 21 and the barrier layer 22.

Figure 8B:
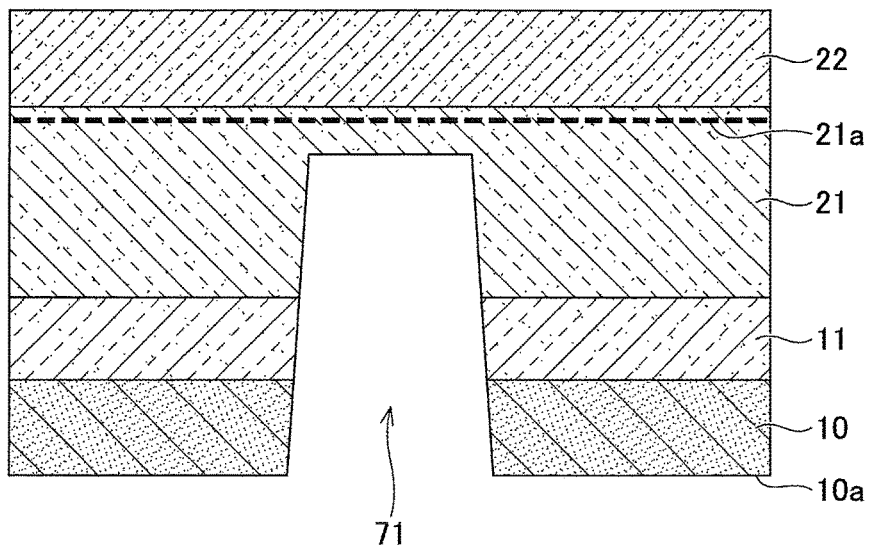

Next, as depicted in FIG. 8B, a groove 71 is formed from a back surface 10a (bottom surface in the figure) of the substrate 10 in the region where the gate electrode 31 is formed. Specifically, a photoresist is applied to the back surface 10a (bottom surface in the figure) of the substrate 10, the applied photoresist is then exposed and developed by an exposure device, thereby forming a resist pattern (not depicted) having an opening in a region where the groove 71 is to be formed. Thereafter, part of the substrate 10, the buffer layer 11, and the electron transit layer 21 in the opening of the resist pattern is removed to form the groove 71. In the first embodiment, the groove 71 is formed by removing the electron transit layer 21 until the thickness of the electron transit layer 21 reaches approximately 200 nm. As described above, since the buffer layer 11 contains numerous dislocations and the like, it is preferable to remove the buffer layer 11 until the electron transit layer 21 is exposed at the undersurface of the groove 71.

Figure 9A:
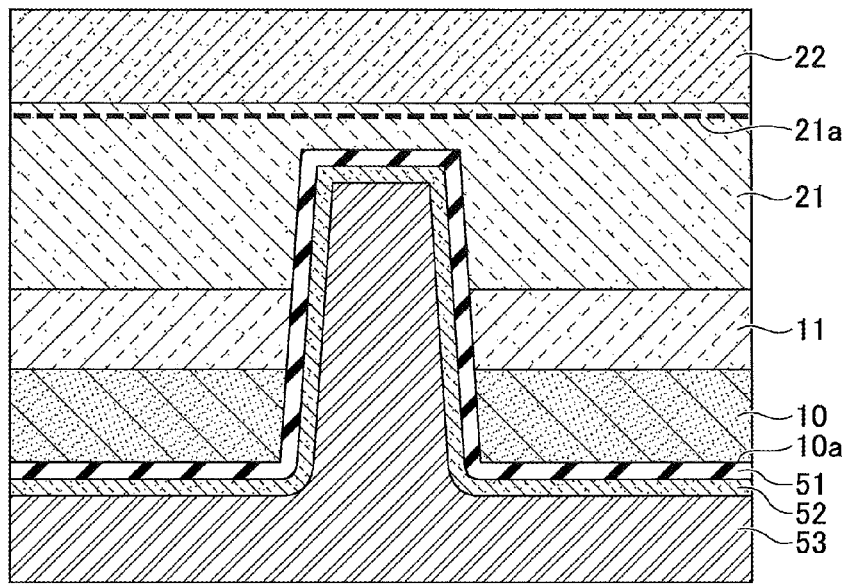
FIGS. 9A and 9B are process diagrams (2) of a method for fabricating a semiconductor device according to the first embodiment.

Next, as illustrated in FIG. 9A, the groove 71 is completely filled (embedded) by forming a first intermediate layer 51, a second intermediate layer 52, and the heat dissipation layer 53 on the back surface 10a side (the bottom side in the figure) of the substrate 10. Specifically, the first intermediate layer 51 is formed by depositing SiN having a thickness of approximately 5 nm by chemical vapor deposition (CVD). The second intermediate layer 52 is formed by depositing SiC having a thickness of approximately 5 nm by sputtering or the like. The heat dissipation layer 53 is formed by depositing diamond formed by CVD until the groove 71 is completely embedded.

Figure 9B:
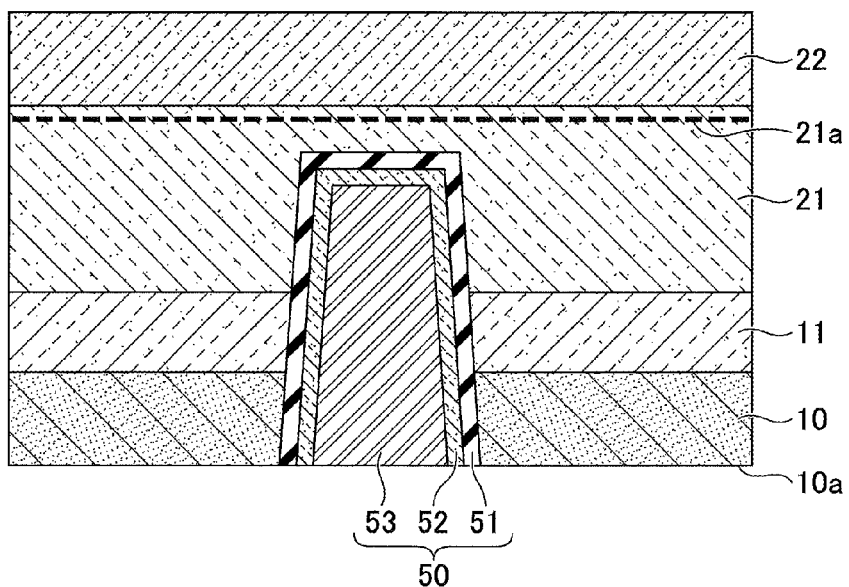

Next, as depicted in FIG. 9B, the first intermediate layer 51, the second intermediate layer 52, and the heat dissipation layer 53 where formed on the back surface 10a (bottom surface in the figure) of the substrate 10 are removed by chemical mechanical polishing (CMP) or the like to expose the back surface 10a (bottom surface in the figure) of the substrate 10. As a result, the groove 71 is completely filled with the first intermediate layer 51, the second intermediate layer 52, and the heat dissipation layer 53, and the heat dissipation part 50 is formed.

Figure 10A:
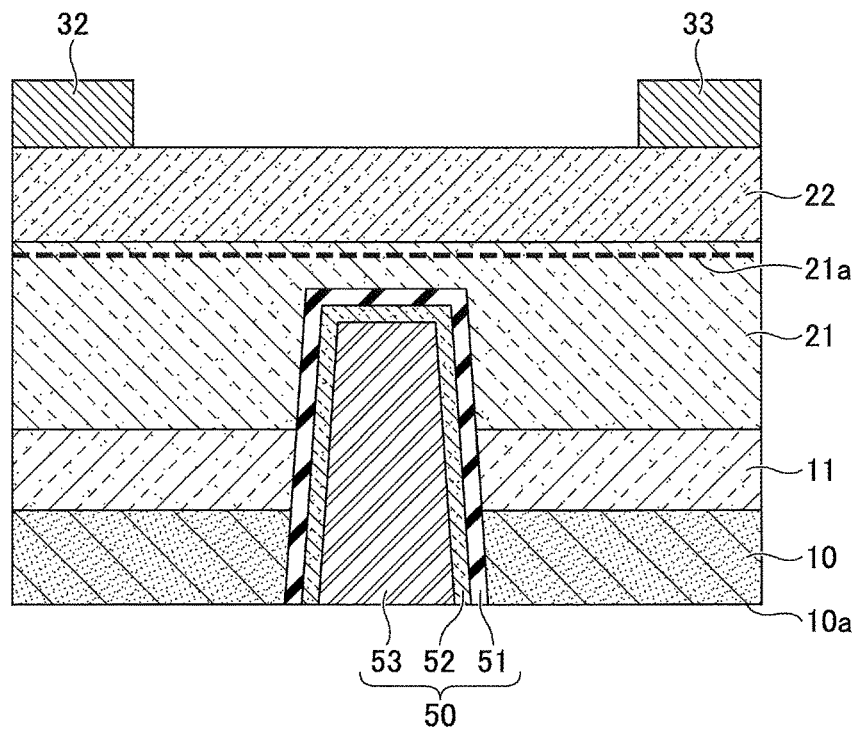
FIGS. 10A and 10B are process diagrams (3) of a method for fabricating a semiconductor device according to the first embodiment.

Next, as depicted in FIG. 10A, the source electrode 32 and the drain electrode 33 are formed on the barrier layer 22. Specifically, a photoresist is applied to the barrier layer 22 and the applied photoresist is then exposed and developed by an exposure device to form a resist pattern (not depicted) having an opening in a region where the source electrode 32 and the drain electrode 33 are formed. Thereafter, a metallic multilayer film of Ti (film thickness: 100 nm)/Al (film thickness: 300 nm) is formed by vacuum evaporation or the like, and is then immersed in an organic solvent or the like, whereby the metallic multilayer film deposited on a not illustrated resist pattern is removed by lift-off. As a result, a source electrode 32 and a drain electrode 33 are formed by the Ti/Al metallic multilayer film remaining on the barrier layer 22. Then, rapid thermal annealing (RTA) is performed at a temperature of 600° C. to make an Ohmic contact.

Figure 10B:
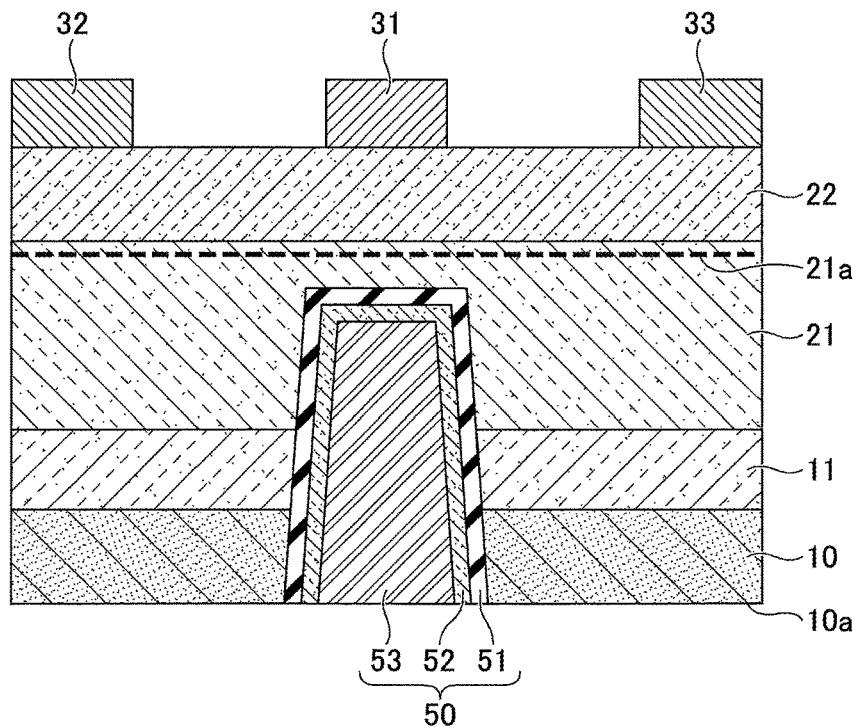

Next, as depicted in FIG. 10B, a gate electrode 31 is formed on the barrier layer 22. Specifically, a photoresist is applied to the barrier layer 22, and the applied photoresist is then exposed and developed by an exposure device, thereby forming a resist pattern (not depicted) having an opening in a region where the gate electrode 31 is to be formed. Thereafter, a metallic multilayer film of Ni (film thickness: 50 nm)/Au (film thickness: 300 nm) is formed by vacuum evaporation or the like, and is then immersed in an organic solvent or the like, whereby the metallic multilayer film deposited on a resist pattern is removed by lift-off. As a result, the gate electrode 31 is formed by the Ni/Au metallic multilayer film remaining on the barrier layer 22.

Second Embodiment

Figure 11:
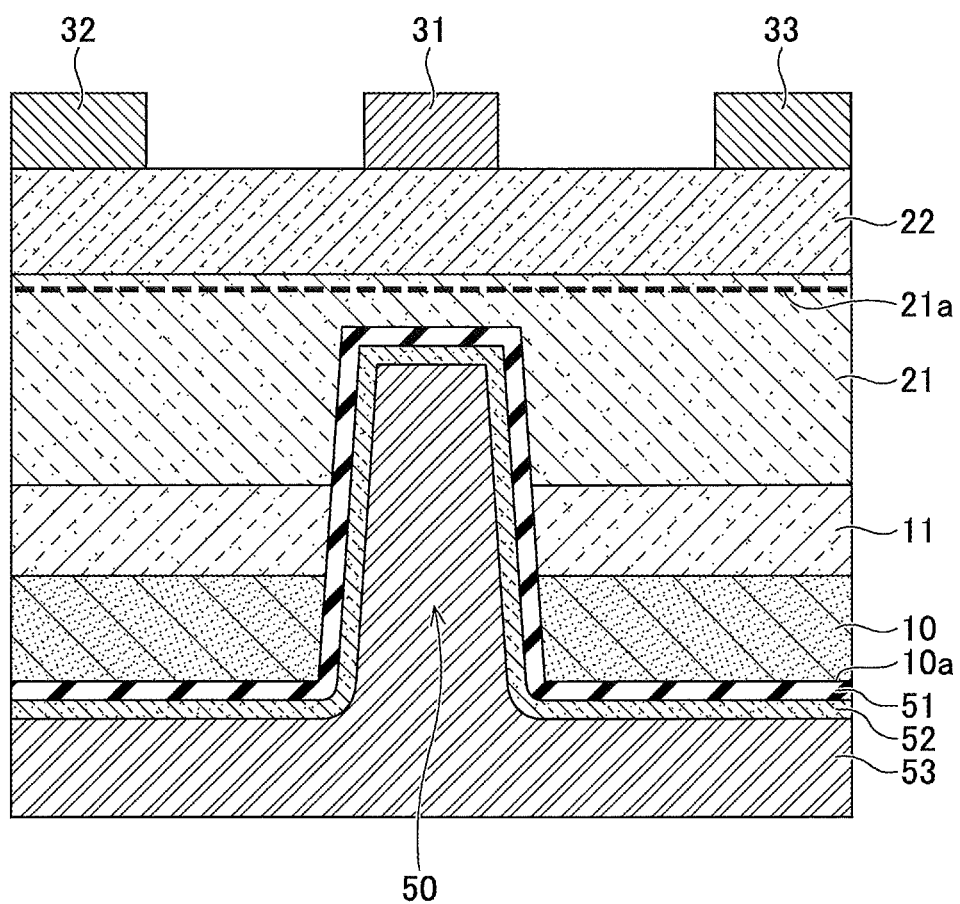
FIG. 11 is a structural view of a semiconductor device according to a second embodiment.

Next, a semiconductor device according to a second embodiment will be described. In the second embodiment, as illustrated in FIG. 11, the first intermediate layer 51, the second intermediate layer 52, and the heat dissipation layer 53 are also formed on the back surface 10a (bottom surface in the figure) of the substrate 10. Accordingly, heat dissipation efficiency may be further enhanced by forming the heat dissipation layer 53 on the back surface 10a (bottom surface in the figure) of the substrate 1.

The method for fabricating a semiconductor device in the second embodiment is the same as the method for fabricating the semiconductor device in the first embodiment except that steps depicted in FIGS. 10A and 10B are performed after the steps depicted in FIGS. 8A to 9A are conducted. That is, the semiconductor device in the second embodiment may be fabricated without performing a step, as illustrated in FIG. 9B, of removing the first intermediate layer 51, the second intermediate layer 52, and the heat dissipation layer 53 where formed on the back surface 10a (bottom surface in the figure) of the substrate 10 by CMP or the like. Hence, since a number of fabrication steps is reduced, the fabrication process may be simplified and the semiconductor device may thus be fabricated at low cost.

Figure 12:
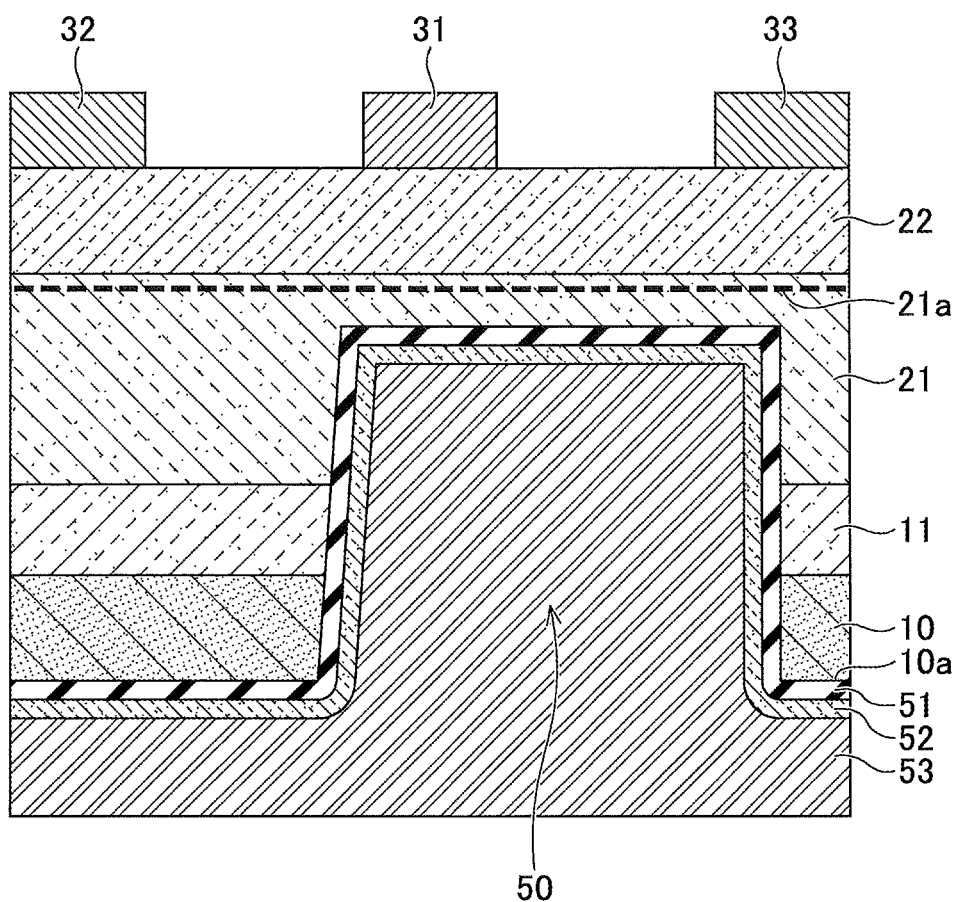
FIG. 12 is a structural view (1) of a modification of the semiconductor device in the second embodiment.

In the semiconductor device depicted in FIG. 11, a heat dissipation part 50 is formed in a region immediately below the gate electrode 31; however, in the semiconductor device in the second embodiment, the heat dissipation part 50 may extend in a region between the gate electrode 31 and the drain electrode 33, as illustrated in FIG. 12. As a result, heat dissipation efficiency may further be enhanced.

Figure 13:
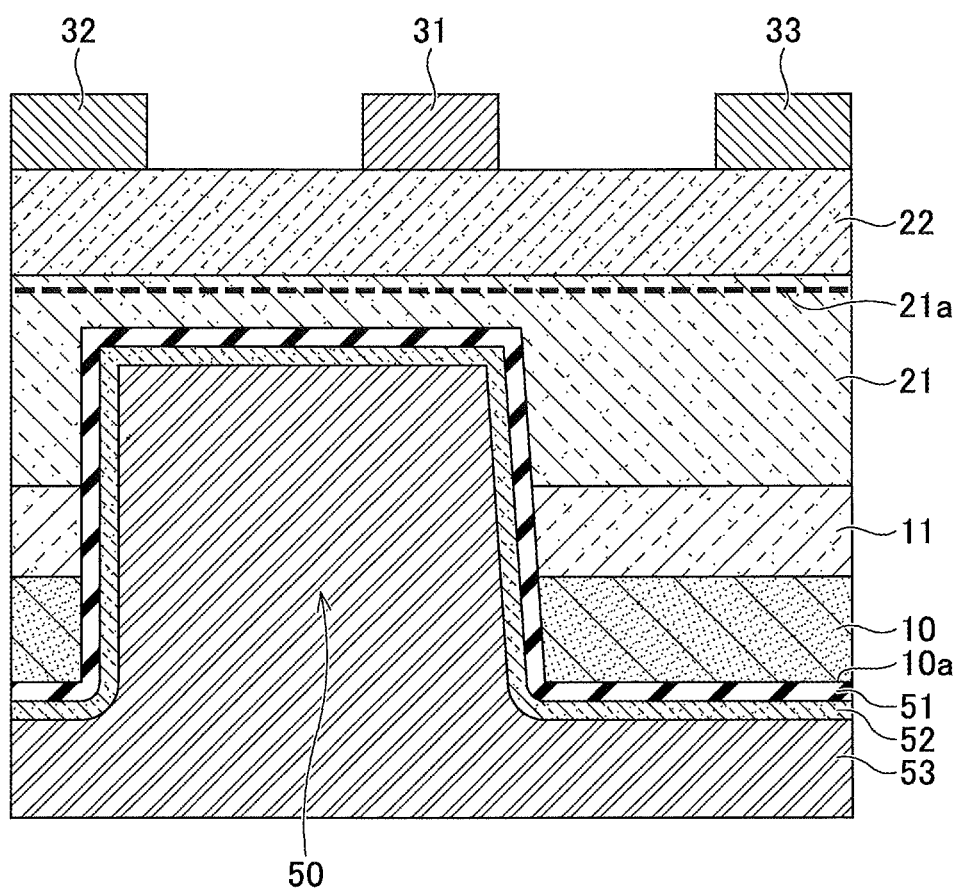
FIG. 13 is a structural view (2) of a modification of the semiconductor device in the second embodiment.
Figure 14:
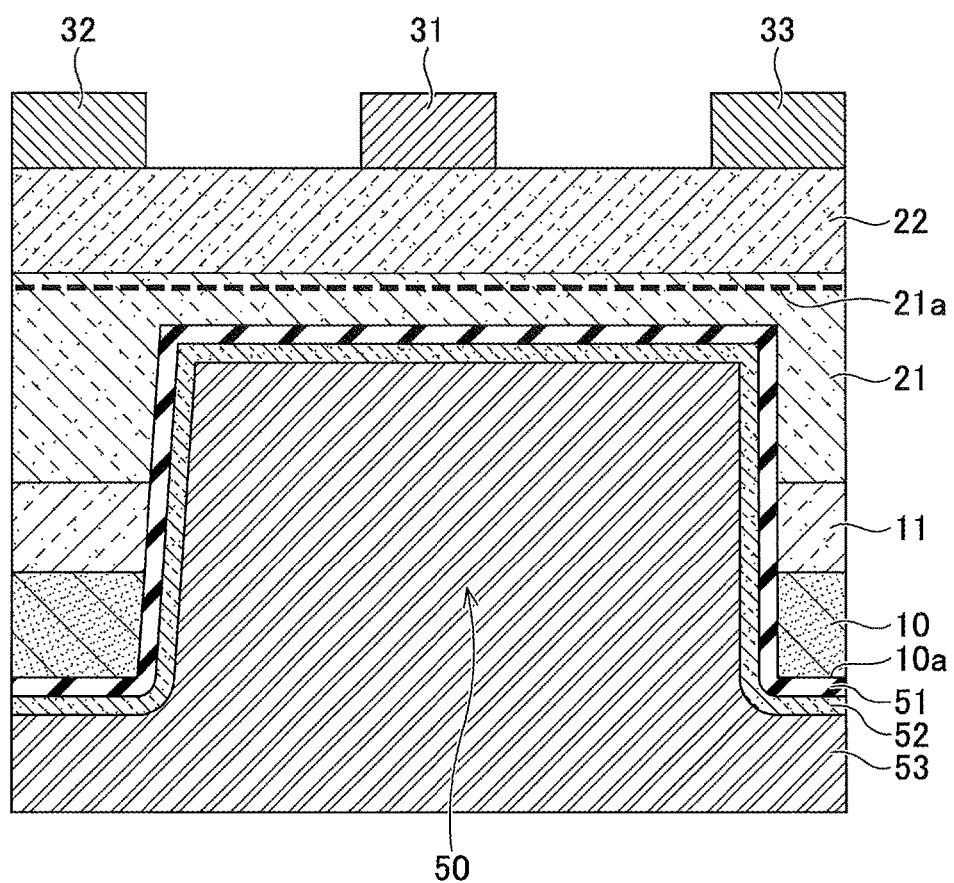
FIG. 14 is a structural view (3) of a modification of the semiconductor device in the second embodiment.

Similarly, in the semiconductor device according to the second embodiment, the heat dissipation part 50 may be formed in a region immediately below the gate electrode 31 and between the gate electrode 31 and the source electrode 32, as illustrated in FIG. 13. Furthermore, as illustrated in FIG. 14, the heat dissipation part 50 may be formed in a region between the source electrode 32 and the drain electrode 33 including immediately below the gate electrode 31.

Figure 15:
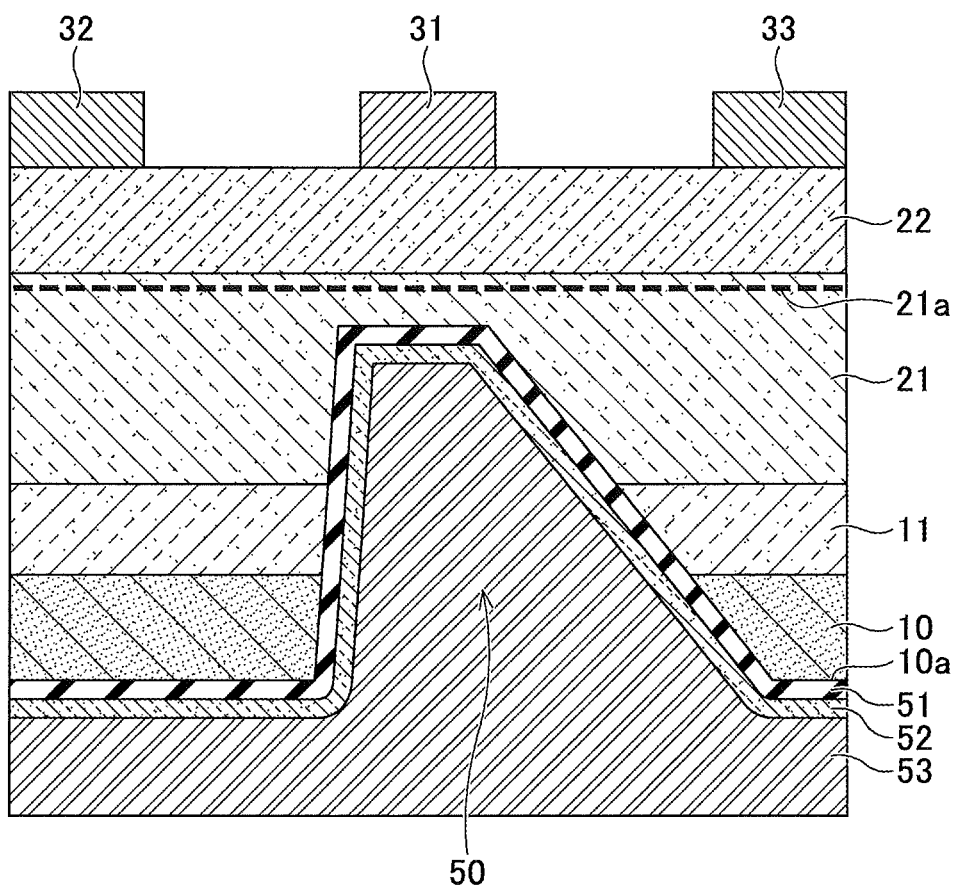
FIG. 15 is a structural view (4) of a modification of the semiconductor device in the second embodiment.

Furthermore, as illustrated in FIG. 15, in the semiconductor device in the second embodiment, the depth to the formed heat dissipation part 50 between the gate electrode 31 and the drain electrode 33 may be increased as the distance from the gate electrode 31 increases.

Note that contents of the semiconductor device in the second embodiment other than those described above may be similar to those of the semiconductor device in the first embodiment. Further, the region where the heat dissipation part 50 is formed may also be applied to the first embodiment.

Third Embodiment

Figure 16:
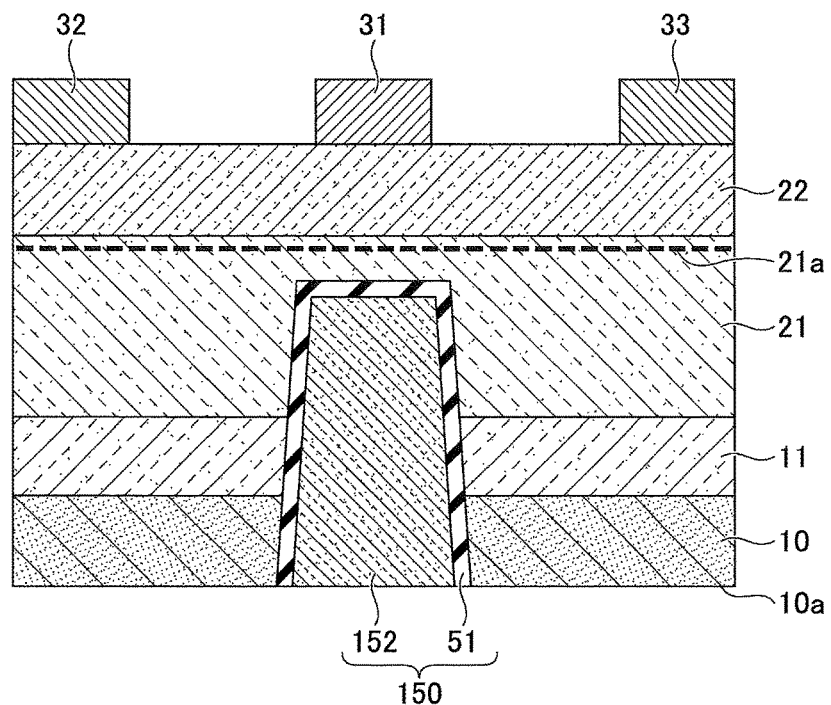
FIG. 16 is a structural view of a semiconductor device according to a third embodiment.

Next, a semiconductor device according to a third embodiment will be described. In the semiconductor device according to the third embodiment, the heat dissipation part 150 is formed of the first intermediate layer 51 and a silicon carbide (SiC) film 152, as illustrated in FIG. 16. Specifically, the first intermediate layer 51 is first formed in the groove formed in the back surface 10*a* (bottom surface in the figure) of the substrate 10 and the SiC film 152 is formed on the first intermediate layer 51 to embed the groove, thereby forming the heat dissipation part 150. The SiC film 152 has, though not as high as diamond, high thermal conductivity and high insulation properties. Accordingly, although the heat dissipation characteristics are slightly inferior to those of the first embodiment, a semiconductor device with satisfactory heat dissipation at a low cost may be obtained by forming the heat dissipation part 150 with the first intermediate layer 51 and the SiC film 152.

Note that contents of the semiconductor device in the third embodiment other than those described above may be similar to those of the semiconductor device in the first embodiment.

Fourth Embodiment

Figure 17:
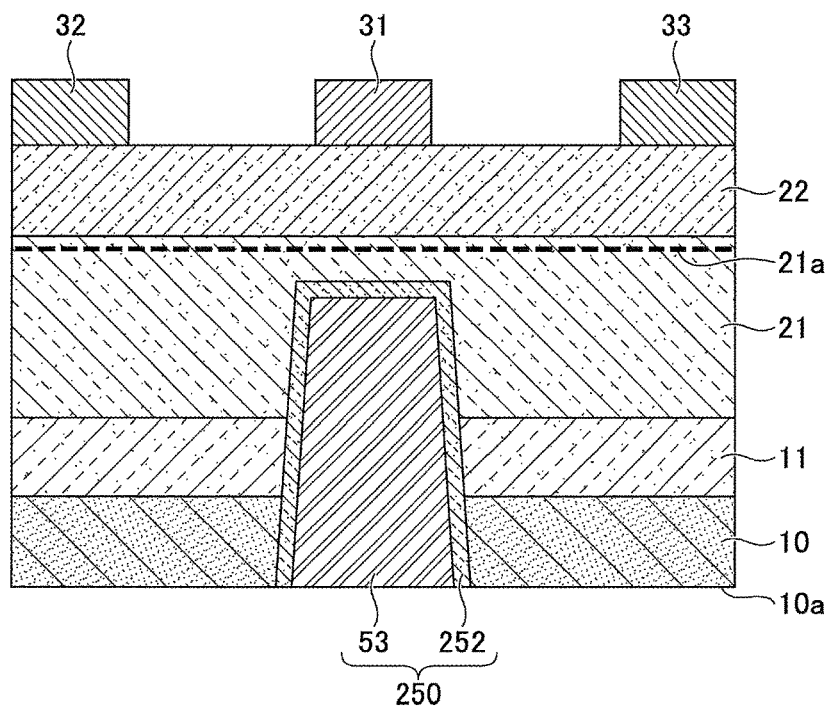
FIG. 17 is a structural view of a semiconductor device according to a fourth embodiment.

Next, a semiconductor device according to a fourth embodiment will be described. In the semiconductor device according to the fourth embodiment, a heat dissipation part 250 is formed of a SiC film 252 and the heat dissipation layer 53, as illustrated in FIG. 17. Specifically, the SiC film 252 is first formed in the groove formed in the back surface 10*a* (bottom surface in the figure) of the substrate 10 and the heat dissipation layer 53 is formed on the SiC film 53 to embed the groove, thereby forming the heat dissipation part 250. The adhesive force between the nitride semiconductor layer and the SiC film 252 may be slightly lowered as compared with the first embodiment; however, a semiconductor device with satisfactory heat dissipation will be obtained at low cost. In the fourth embodiment, the heat dissipation layer 53 is made of a material having high thermal conductivity and insulation properties such as diamond or the like.

Note that contents of the semiconductor device in the fourth embodiment excluding those described above may be similar to those of the semiconductor device in the first embodiment.

Fifth Embodiment

Figure 18:
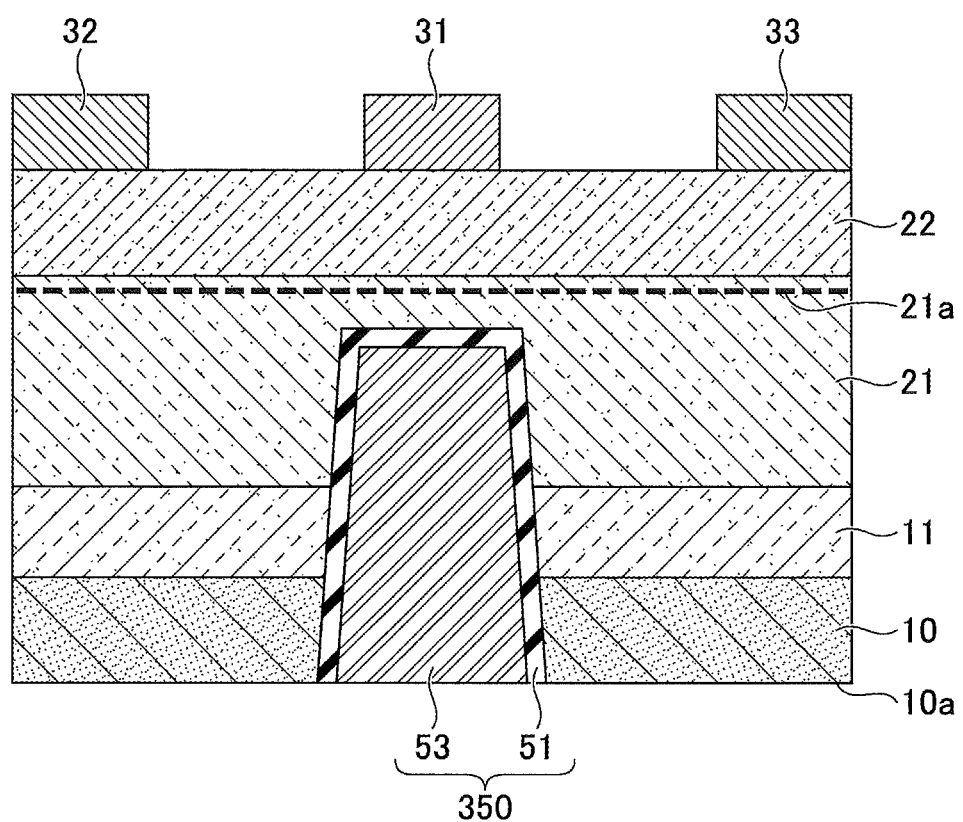
FIG. 18 is a structural view of a semiconductor device according to a fifth embodiment.

Next, a semiconductor device according to a fifth embodiment will be described. In the semiconductor device according to the fifth embodiment, a heat dissipation part 350 is formed of the first intermediate layer 51 and the heat dissipation layer 53, as illustrated in FIG. 18. Specifically, the first intermediate layer 51 is first formed in the groove formed in the back surface 10*a* (bottom surface in the figure) of the substrate 10 and the heat dissipation layer 53 is formed on the first intermediate layer 51 to embed the groove, thereby forming the heat dissipation part 350. The adhesive force between the first intermediate layer 51 and the heat dissipation layer 53 may be slightly lower compared to the first embodiment; however, a semiconductor device with satisfactory heat dissipation may be obtained at low cost.

Note that contents of the semiconductor device in the fifth embodiment other than those described above may be similar to those of the semiconductor device in the first embodiment.

Sixth Embodiment

Next, a semiconductor device according to a sixth embodiment will be described. The sixth embodiment includes a semiconductor device, a power supply device, and a high frequency amplifier.

Figure 19:
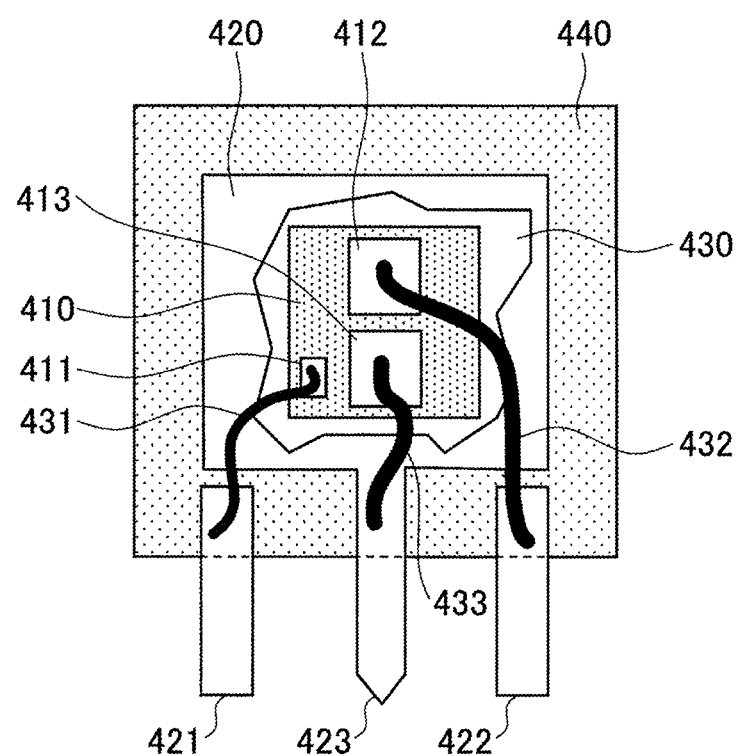
FIG. 19 is an explanatory view of a discretely packaged semiconductor device in a sixth embodiment.

The semiconductor device in the sixth embodiment is formed of any one of the semiconductor devices according to the first to fifth embodiments that is discretely packaged. Such a discretely packaged semiconductor device will be described with reference to FIG. 19. Note that FIG. 19 schematically depicts the inside of the discretely packaged semiconductor device, and the arrangement of the electrodes and the like are different from those illustrated in the first to fifth embodiments.

First, the semiconductor device fabricated according to the first to fifth embodiments is cut by dicing or the like, thereby forming a semiconductor chip 410 that is a HEMT of a GaN-based semiconductor material. The semiconductor chip 410 is fixed on a lead frame 420 with a die attach agent 430 such as solder. The semiconductor chip 410 corresponds to the semiconductor device according to the first to fifth embodiments.

Next, a gate electrode 411 is connected to a gate lead 421 via a bonding wire 431, a source electrode 412 is connected to a source lead 422 via a bonding wire 432, and a drain electrode 413 is connected to a drain lead 423 via a bonding wire 433. The bonding wires 431, 432, and 433 are made of a metallic material such as Al. Further, in the sixth embodiment, the gate electrode 411 is a gate electrode pad, and is connected to the gate electrode 31 of the semiconductor device in the first to fifth embodiments. The source electrode 412 is a source electrode pad, and is connected to the source electrode 32 of the semiconductor device according to the first to fifth embodiments. The drain electrode 413 is a drain electrode pad, and is connected to the drain electrode 33 of the semiconductor device according to the first to fifth embodiments.

Next, resin seal is applied using mold resin 440 by a transfer molding method. Accordingly, a discretely packaged HEMT semiconductor device may be fabricated using a GaN-based semiconductor material.

Next, the power supply device and the high frequency amplifier in the sixth embodiment will be described. The power supply device and the high frequency amplifier in the sixth embodiment are a power supply device and a high frequency amplifier using any of the semiconductor devices according to the first to fifth embodiments.

Figure 20:
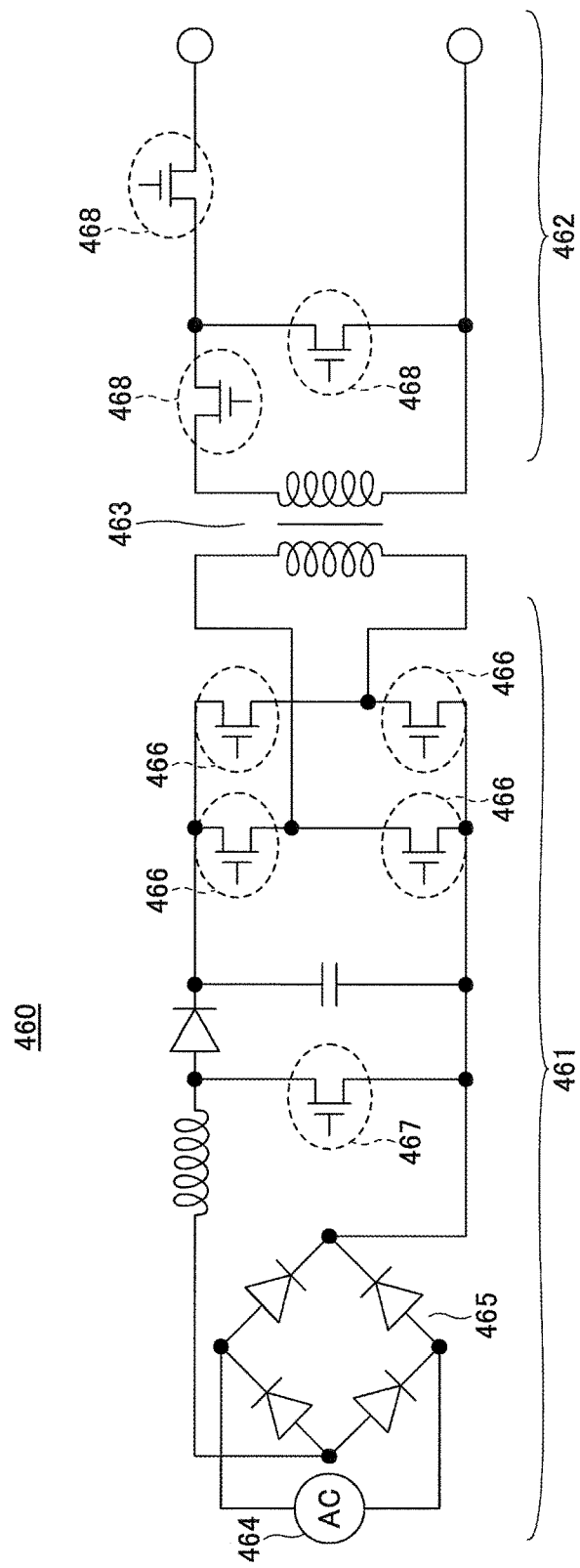
FIG. 20 is a circuit diagram of a power supply device in the sixth embodiment.

First, a power supply device according to the sixth embodiment will be described with reference to FIG. 20. The power supply device 460 according to the sixth embodiment includes a high-voltage primary circuit 461, a low-voltage secondary circuit 462, and a transformer 463 disposed between the primary circuit 461 and the secondary circuit 462. The primary circuit 461 includes an AC power supply 464, an as-termed bridge rectification circuit 465, multiple switching elements (four switching elements in the example depicted in FIG. 20) 466, one switching element 467, and the like. The secondary circuit 462 includes multiple switching elements (three switching elements in the example depicted in FIG. 20) 468. In the example depicted in FIG. 20, the semiconductor devices according to the first to fifth embodiments are used as the switching elements 466 and 467 of the primary circuit 461. Note that the switching elements 466 and 467 of the primary circuit 461 are preferably normally-off semiconductor devices. In addition, the switching element 468 in the secondary circuit 462 uses an ordinary metal insulator semiconductor field effect transistor (MISFET) formed of silicon.

Figure 21:
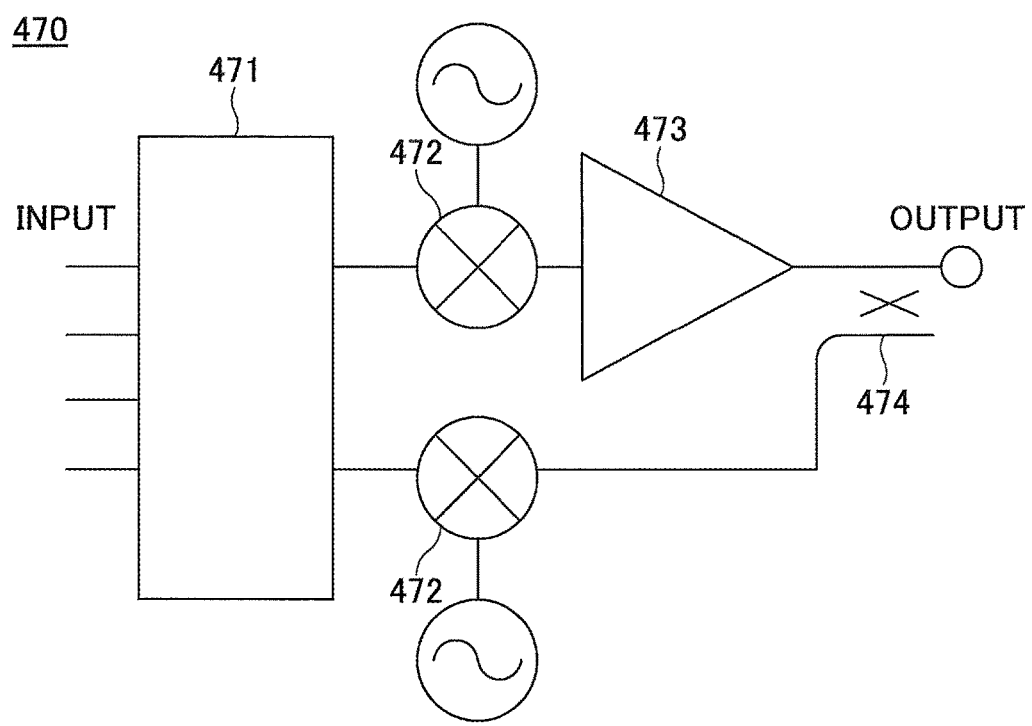
FIG. 21 is a structural diagram of a high power amplifier in the sixth embodiment.

Next, a high-frequency amplifier in the sixth embodiment will be described with reference to FIG. 21. The high-frequency amplifier 470 in the sixth embodiment may be applied to a power amplifier for a mobile phone base station, for example. The high-frequency amplifier 470 includes a digital predistortion circuit 471, mixers 472, a power amplifier 473, and a directional coupler 474. The digital predistortion circuit 471 compensates for nonlinear distortion of an input signal. The mixers 472 mix the input signal, of which nonlinear distortion is compensated, with an alternating current (AC) signal. The power amplifier 473 amplifies the input signal mixed with the AC signal. In the example illustrated in FIG. 21, the power amplifier 473 includes any of the semiconductor devices according to the first to fifth embodiments. The directional coupler 474 monitors input signals and output signals. In the circuit illustrated in FIG. 21, the output signal may, for example, be mixed with the AC signal by the mixers 472 by switching ON or OFF the switch, and the mixed signal may be sent to the digital predistortion circuit 471.

According to the disclosed embodiments of the semiconductor device, control against both the off-leakage current and the current collapse may be enabled without increasing the temperature of the semiconductor device.

The embodiments of the present invention have been described in detail above; however, the present invention is not limited to a specific one of the embodiments, and various modifications and changes may be made within the scope described in the claims.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. A method for fabricating a semiconductor device, the method comprising:
    sequentially forming on a substrate, with one or more compound semiconductors, a buffer layer, a first semiconductor layer, and a second semiconductor layer;
    forming a groove in a back surface of the substrate;
    forming a first intermediate layer on inner surfaces of the groove;
    forming a heat dissipation layer on the first intermediate layer on the inner surfaces of the groove to form a heat dissipation part including the first intermediate layer and the heat dissipation layer that are integrally disposed on the inner surfaces of the groove; and
    forming a gate electrode, a source electrode, and a drain electrode on the second semiconductor layer, wherein
    the groove is formed in the back surface of the substrate by removing the substrate, the buffer layer, and a portion of the first semiconductor layer in a region of the back surface below the gate electrode, so that a thickness of the rest of the first semiconductor layer where the portion of the first semiconductor layer is removed to form the groove reaches a predetermined thickness,
    the heat dissipation part is disposed below the gate electrode and above the back surface of the substrate,
    the heat dissipation layer is formed of a material containing carbon, and
    the thickness of the rest of the first semiconductor layer between the gate electrode and the heat dissipation part is 50 nm or more and 500 nm or less.

2. The method as claimed in claim 1, further comprising:
    forming a second intermediate layer on the first intermediate layer after the first intermediate layer is formed on the inner surfaces of the groove, wherein
    the heat dissipation layer is formed on the second intermediate layer, and
    the second intermediate layer is formed of a material including both an element contained in the first intermediate layer and carbon.

3. The method as claimed in claim 1, further comprising:
    removing, after the heat dissipation part is formed on the first intermediate layer, a portion of the heat dissipation part formed on the back surface of the substrate.

4. A semiconductor device comprising:
    a buffer layer formed of a compound semiconductor on a substrate;
    a first semiconductor layer formed of a compound semiconductor on the buffer layer;
    a second semiconductor layer formed of a compound semiconductor on the first semiconductor layer;
    a gate electrode, a source electrode, and a drain electrode formed on the second semiconductor layer; and
    a heat dissipation part formed in a groove in a back surface of the substrate and disposed below the gate electrode and above the back surface of the substrate, wherein
    the groove is formed in the back surface of the substrate by removing the substrate, the buffer layer, and a portion of the first semiconductor layer in a region of the back surface below the gate electrode, so that a thickness of the rest of the first semiconductor layer where the portion of the first semiconductor layer is removed to form the groove reaches a predetermined thickness,
    the entire second semiconductor layer and the rest of the first semiconductor layer are present between the gate electrode and the heat dissipation part,
    the heat dissipation part includes a heat dissipation layer, and a first intermediate layer which is formed between the heat dissipation layer and the buffer layer and between the heat dissipation layer and the first semiconductor layer,
    the heat dissipation layer is formed of a material containing carbon, and
    the thickness of the rest of the first semiconductor layer between the gate electrode and the heat dissipation part is 50 nm or more and 500 nm or less.

5. The semiconductor device as claimed in claim 4, wherein
    the first semiconductor layer is formed of a material containing GaN, and
    the second semiconductor layer is formed of a material containing AlGaN or InAlN.

6. The semiconductor device as claimed in claim 4, wherein
    the heat dissipation part is further formed below a region between the gate electrode and the source electrode.

7. The semiconductor device as claimed in claim 4, wherein
    the heat dissipation layer is formed of a material containing any of diamond, carbon nanotube, graphene, and nanodiamond.

8. The semiconductor device as claimed in claim 4, wherein
    the first intermediate layer is formed of a material containing any of SiC, AlC, SiCN, and carbon nitride.

9. The semiconductor device as claimed in claim 4, wherein
    the first intermediate layer is formed of a material containing SiN or AlN.

10. The semiconductor device as claimed in claim 4, wherein
the heat dissipation part is further formed on a back surface of the substrate.

11. The semiconductor device as claimed in claim 4, wherein
each of the compound semiconductors is a nitride semiconductor.

12. The semiconductor device as claimed in claim 4, wherein
the thickness of the first intermediate layer is 10 nm or less.

13. A power supply device comprising:
the semiconductor device as claimed in claim 4.

14. An amplifier comprising:
the semiconductor device as claimed in claim 4.

15. The semiconductor device as claimed in claim 4, wherein
the heat dissipation part is further formed below a region between the gate electrode and the drain electrode.

16. The semiconductor device as claimed in claim 15, wherein
the depth from a top surface of the second semiconductor layer to the heat dissipation part increases as a distance from the gate electrode increases.

17. The semiconductor device as claimed in claim 4, wherein
the heat dissipation part includes a second intermediate layer formed between the first intermediate layer and the heat dissipation layer, and
the second intermediate layer is formed of a material including both an element contained in the first intermediate layer and carbon.

18. The semiconductor device as claimed in claim 17, wherein
the second intermediate layer is formed of a material containing any of SiC, AlC, SiCN, and carbon nitride.

19. The semiconductor device as claimed in claim 17, wherein
the thickness of the second intermediate layer is 10 nm or less.

* * * * *